United States Patent
Kelly et al.

(10) Patent No.: US 9,412,605 B2
(45) Date of Patent: Aug. 9, 2016

(54) METHOD OF REMOVING OXIDE ON SEMICONDUCTOR SURFACE BY LAYER OF SULFUR

(71) Applicant: TAIWAN SEMICONDUCTOR MANUFACTURING CO., LTD., Hsinchu (TW)

(72) Inventors: Andrew Joseph Kelly, Hsinchu County (TW); Yusuke Oniki, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 8 days.

(21) Appl. No.: 14/454,606

(22) Filed: Aug. 7, 2014

(65) Prior Publication Data
US 2016/0042966 A1 Feb. 11, 2016

(51) Int. Cl.
*H01L 21/02* (2006.01)
*H01L 21/306* (2006.01)
*H01L 21/324* (2006.01)
*H01L 21/311* (2006.01)
*H01L 21/316* (2006.01)

(52) U.S. Cl.
CPC .... *H01L 21/30621* (2013.01); *H01L 21/02057* (2013.01); *H01L 21/02301* (2013.01); *H01L 21/02658* (2013.01); *H01L 21/30604* (2013.01); *H01L 21/31111* (2013.01); *H01L 21/31604* (2013.01); *H01L 21/324* (2013.01)

(58) Field of Classification Search
CPC ................. H01L 21/31111; H01L 21/02057; H01L 21/30604; H01L 21/31604; H01L 21/02658; H01L 21/02301

USPC .......................................... 438/689; 257/442
See application file for complete search history.

(56) References Cited

U.S. PATENT DOCUMENTS

2015/0170914 A1 *  6/2015  Haukka et al. .... H01L 21/02568

OTHER PUBLICATIONS

Shiyu Sun, et al., "Surface termination and roughness of Ge(100) cleaned by HF and HCI solutions," Appl. Phys. Lett. 88, 021903,2006.
Sonja Sionck, et al., "Etch Rates of Ge, GaAs and InGaAs in Acids, Bases and Peroxide Based Mixtures," ECS Trans., vol. 16, Issue 10, pp. 451-460, 2008.
E. O'Connor, et al., "A systematic study of (NH4)2S passivation (22%, 10%, 5% or 1%) on the interface properties of the Al2O3/In0.53Ga0.47 As/InP system for n-type and p-type In0.53Ga0.47As epitaxial layers," Journal of Applied Physics., 109, 024101, 2011.

(Continued)

*Primary Examiner* — Howard Weiss
*Assistant Examiner* — Tifney Skyles
(74) *Attorney, Agent, or Firm* — McDermott Will & Emery LLP

(57) ABSTRACT

Embodiments of the present disclosure relate generally to a method of passivating and/or removing oxides on a semiconductor surface by using ammonium sulfide, the ammonium sulfide is formed by reacting ammonia and hydrogen sulfide in a semiconductor processing chamber, therefore the ammonium sulfide can be used to clean and remove oxides on a semiconductor surface without the concern of ESH and storage, the ammonium sulfide can also be used to passivate a semiconductor surface by forming a layer of sulfur, and thus preventing the reformation of native oxides, the layer of sulfur can be optionally removed to reduce the thickness of the semiconductor material.

20 Claims, 10 Drawing Sheets

(56) References Cited

OTHER PUBLICATIONS

Louis M. Nelen, et al., "Adsorption and decomposition of H2S on the Ge(100) surface," Appl. Surf. Sci., 150, pp. 65-72, 1999.

M. Houssa, et al., H2S exposure of a (100)Ge surface: Evidences for a (2x1) electrically passivated surface, Appl. Phys. Lett., 90, 222105, 2007.

E. O'Connor, "In situ H2S passivation of In0.53Ga0.47 As/In P metal-oxide-semiconductor capacitors with atomic-layer deposited HfO2 gate dielectric," Appln. Phys. Lett., 92, 022902, 2008).

Ji-Wan Kim, et al., "Investigation on the surface characteristics of GaAs after sulfuric-vapor treatment," Thin Solid Films, pp. 335-356 and 423-429, 1999.

Alireza Alian, et al., "Ammonium sulfide vapor passivation of In0.53Ga0.47As and In P surfaces," Appl. Phys. Lett. 99, 112114, 2011.

F. Tang, et al., "In situ sulfur passivation of In0.53Ga0.47As at elevated temperature by (NH4)2 Solution vapor and H2S Treatment in an ALD rector," Proc. of SISC 2013 12.12).

\* cited by examiner

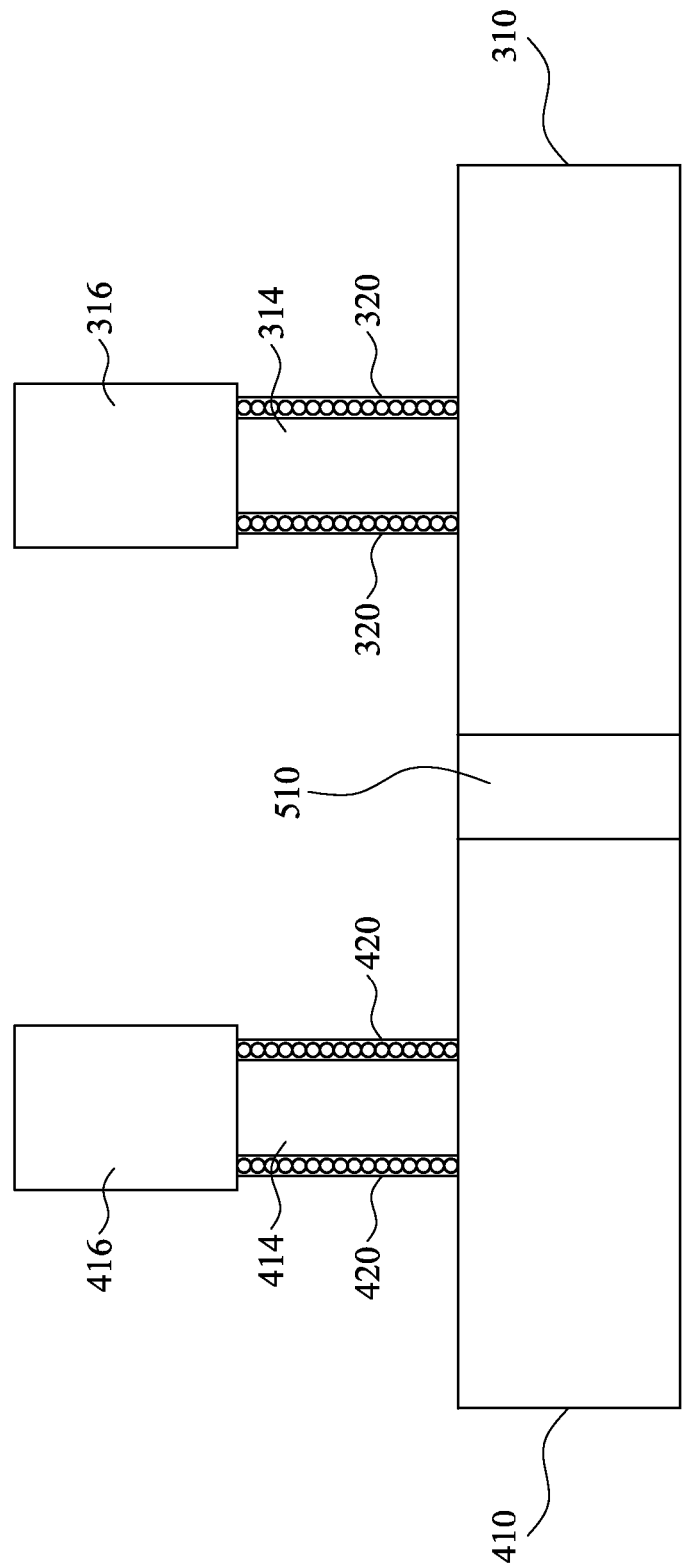

METHOD OF REMOVING OXIDE ON SEMICONDUCTOR SURFACE BY LAYER OF SULFUR

BACKGROUND

In semiconductor manufacturing process, native oxide typically forms when a semiconductor substrate surface is exposed to a surrounding containing oxygen and/or moisture. Oxygen exposure occurs when substrates are moved between processing chambers at atmospheric or ambient conditions, or when a small amount of oxygen remains in a processing chamber.

Native oxide films are usually very thin, for example between 5-20 angstroms, but thick enough to cause difficulties in subsequent fabrication processes. Furthermore, native oxide may cause high contact resistance in source and drain areas and adversely increase the thickness of equivalent of oxide (EOT) in channel areas. Therefore, a native oxide layer is typically undesirable and needs to be removed prior to subsequent fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9, 10A, 10B, 11A, 11B, and 12 are schematic diagrams illustrating a VGAA nanowire FET structure that may utilize the method depicted in FIG. 1 and/or FIG. 6, in accordance with some embodiments.

DETAILED DESCRIPTION

Figure 1:
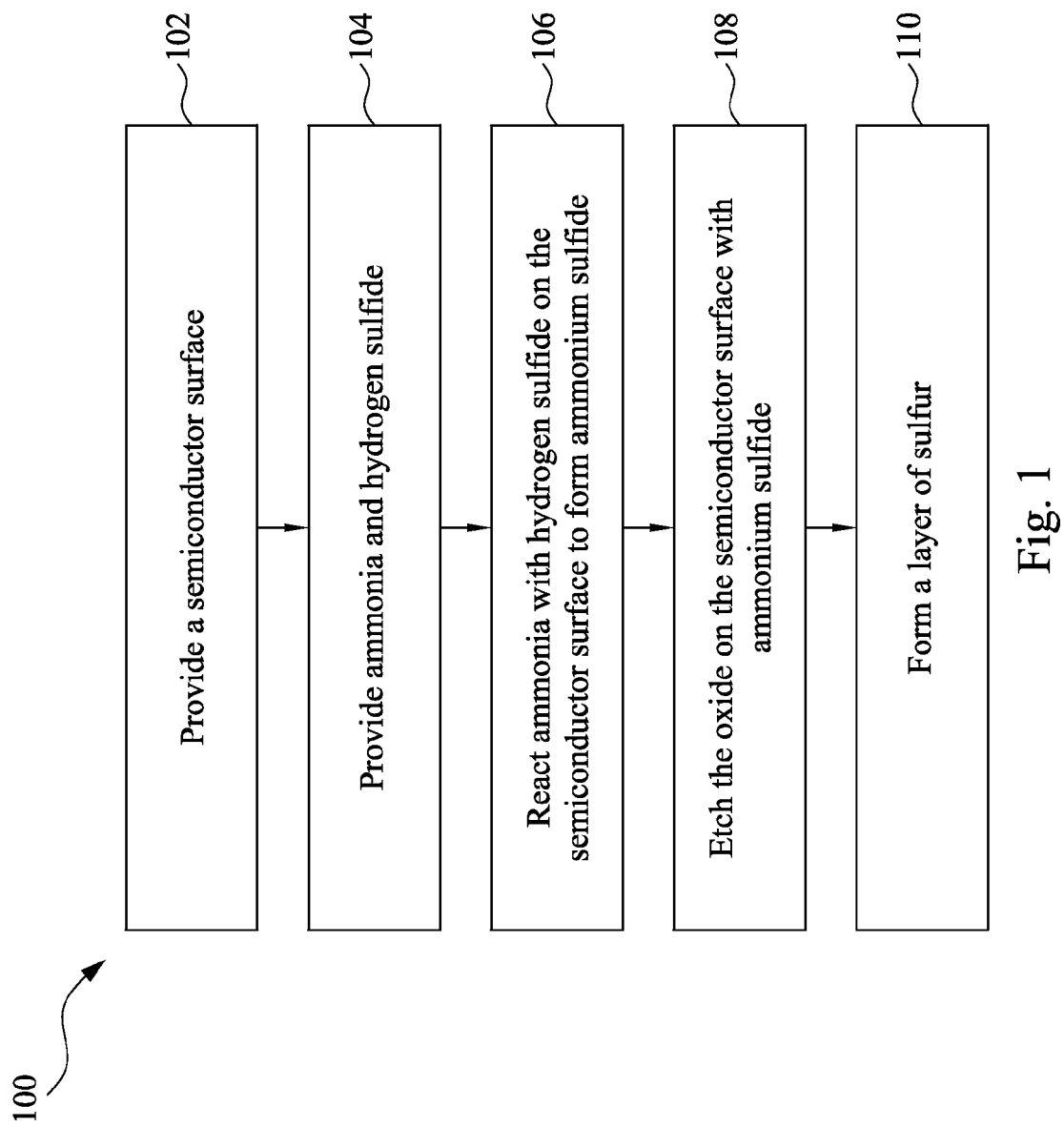
FIG. 1 is a flow chart illustrating a method of passivating and removing an oxide layer on a semiconductor substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method of passivating and removing an oxide layer on a semiconductor substrate, in accordance with some embodiments. FIGS. 2-5 are schematic diagrams illustrating a semiconductor substrate that may utilize the method depicted in FIG. 1, in accordance with some embodiments. With reference to FIGS. 1 through 5 and other figures, the method 100 and the semiconductor substrate in FIGS. 2-5 are collectively described.

Figure 2:
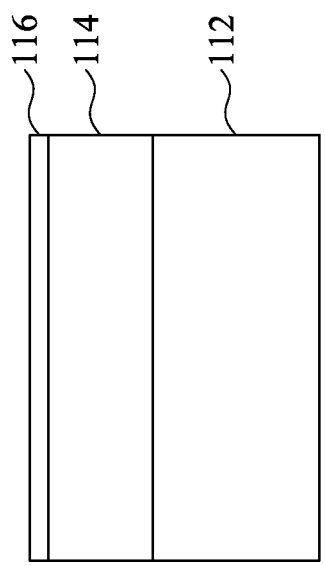
FIGS. 2-5 are schematic diagrams illustrating a semiconductor substrate that may utilize the method depicted in FIG. 1, in accordance with some embodiments.

Referring to FIGS. 1 and 2, the method 100 begins at operation 102, providing a semiconductor surface. The semiconductor substrate in FIG. 2 includes a substrate layer 112, a semiconductor layer 114 and an oxide layer 116. The term "substrate layer" as used herein refers to a layer of material that serves as a basis for subsequent processing operations.

In embodiments, the substrate layer 112 may be a 200 mm, 300 mm or 450 mm silicon wafer, or other substrate used to fabricate microelectronic devices and the like. In one or more embodiments, the substrate layer 112 may be a material such as crystalline silicon (e.g., Si<100>, Si<111> or Si<001>), silicon oxide, strained silicon, silicon$_{(1-x)}$germanium$_x$, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. Furthermore, the substrate layer 112 can also include dielectric materials such as silicon dioxide, organosilicates, and carbon doped silicon oxides. The substrate layer 112 may also include one or more conductive metals, such as nickel, titanium, platinum, molybdenum, rhenium, osmium, chromium, iron, aluminum, copper, tungsten, or combinations thereof. Furthermore, the substrate layer 112 can include any other materials such as metal nitrides, metal oxides and metal alloys, depending on the application. In embodiments, the substrate layer 112 can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

In embodiments, the substrate layer 112 has a semiconductor layer 114 disposed thereon. The semiconductor layer 114 can be a germanium (Ge) containing layer, such as Ge or SiGe, a III-V compound containing layer, and the like. Suitable examples of the III-V compound containing layer include GaAs, InP, InAs, GaAs, GaP, InGaAs, InGaAsP, InAlAs, GaSb, InSb, the like, or combinations thereof.

In some embodiments, the oxide layer 116 is a native oxide formed on the surface of the semiconductor layer 114 due to the exposure to either atmosphere or to one or more fabrication processes that cause native oxide to form, such as a wet process. As the semiconductor layer 114 may be exposed to air or ambient atmosphere, the native oxide formed on the semiconductor layer 114 may have oxygen, nitrogen, carbon, sulfur, or other elements commonly contained in the air. In other embodiments, the oxide layer 116 may be a layer disposed on the semiconductor layer 114 and patterned as a hard mask. In some other embodiments, the oxide layer 116 may be an ammonium sulfide soluble oxide layer (for example, a patterned germanium oxide (GeOx) layer) disposed on a silicon based semiconductor layer and patterned as a hard mask.

Figure 3:
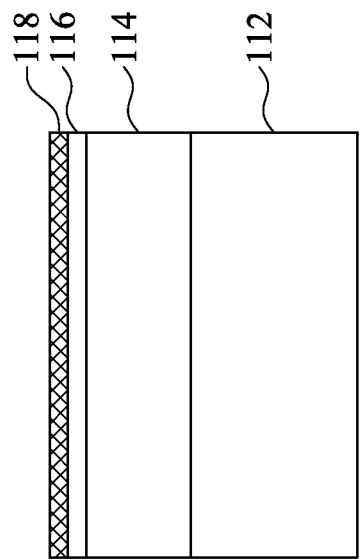

Referring to FIGS. 1 and 3, the method 100 proceeds to operation 104, providing ammonia and hydrogen sulfide. In some embodiments, the semiconductor substrate is placed in a processing chamber, and then supplied with ammonia and hydrogen sulfide. In some embodiments, the ammonia and hydrogen sulfide is supplied from a common source. In other embodiments, the ammonia and hydrogen sulfide are both in gas phase when supplied to the chamber. In some embodiments, the ammonia and hydrogen sulfide is adsorbed onto the surface of the oxide layer 116 of the semiconductor layer 114.

Referring to FIGS. 1 and 3, the method 100 proceeds to operation 106, reacting ammonia and hydrogen sulfide to form ammonium sulfide. In some embodiments, the semiconductor substrate is placed in a processing chamber, and then the ammonia and hydrogen sulfide is reacted to form ammonium sulfide 118. In some embodiments, the ammonia, hydrogen sulfide and ammonium sulfide 118 are all in gas phase while in the chamber. In some embodiments, the ammonia and hydrogen sulfide is adsorbed onto the surface of the oxide layer 116 of the semiconductor layer 114 and reacted to form ammonium sulfide 118. In other embodiments, the ammonia and hydrogen sulfide is reacted in the chamber to form ammonium sulfide 118 and then adsorbed onto the surface of the oxide layer 116 of the semiconductor layer 114.

Figure 4:
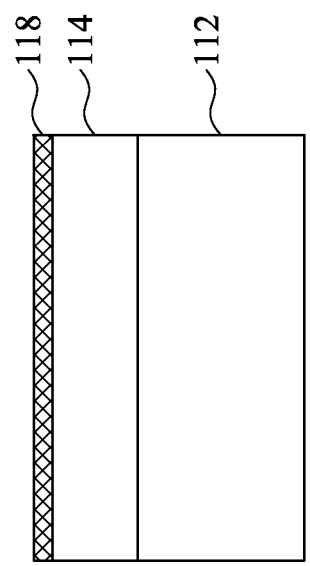

Referring to FIGS. 1 and 4, the method 100 proceeds to operation 108, etching the oxide on the semiconductor layer with ammonium sulfide. The ammonium sulfide 118 on the surface of the oxide layer 116 of the semiconductor layer 114 can etch away the oxide layer 116. In some embodiments, the oxide layer 116 can be a native oxide of the semiconductor layer 114. In other embodiments, the oxide layer 116 can be an ammonium sulfide soluble oxide layer disposed on the semiconductor layer 114.

Figure 5:
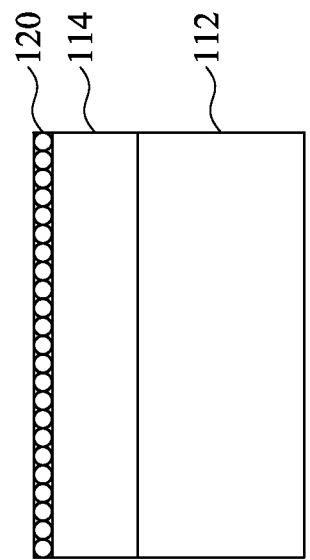

Referring to FIGS. 1 and 5, the method 100 proceeds to operation 110, forming a layer of sulfur. After the ammonium sulfide 118 etches away the oxide layer 116, a layer of sulfur 120 may be formed on the surface of the semiconductor layer 114. In some embodiments, the ammonium sulfide 118 is removed right after etching the oxide layer 116 and the layer of sulfur 120 is not formed. In some embodiments, the ammonium sulfide 118 is removed right after etching the oxide layer 116 by ventilation and the layer of sulfur 120 is not formed. In another embodiment, by controlling the amount of ammonia and hydrogen sulfide, the amount of ammonium sulfide 118 formed is controlled to sufficiently etch the oxide layer 116 but not form a layer of sulfur 120. In some embodiments, a layer of sulfur 120 is formed with the surface of the semiconductor layer 114. In some embodiments, the layer of sulfur 120 as a passivation layer can passivate the surface of the semiconductor layer 114 to prevent contact with air and/or water. In other embodiments, after forming the layer of sulfur 120 with the semiconductor layer 114, the layer of sulfur 120 can further be removed and thereby reducing the thickness of the semiconductor layer 114. In another embodiment, after forming the layer of sulfur 120 with the semiconductor layer 114, the layer of sulfur 120 can further be removed and a layer of native oxide is allowed to form, the native oxide is later etched by a suitable method, by repeating the above operations the thickness of the semiconductor layer 114 can be reduced. In some embodiments, the suitable method for etching the native oxide can be the use of ammonium sulfide as described herein. In some embodiments, the layer of sulfur 120 can be formed and removed a plurality of time to obtain a semiconductor layer 114 with a predefined thickness. In some embodiments, an annealing process can be applied to remove the layer of sulfur 120. In some other embodiments, the annealing process is carried out at a temperature of 200° C. to 400° C. In some embodiments, the layer of sulfur 120 can be formed by the adsorbed hydrogen sulfide. In some embodiments, the layer of sulfur 120 can be formed from the adsorbed hydrogen sulfide and by the reaction of ammonia and hydrogen sulfide. In some embodiments, the annealing process can be carried out in the processing chamber.

In embodiments, after operation 110 of method 100, subsequent layers can be formed and/or subsequent processes can be carried out. In some embodiments, a high-K metal gate layer can be disposed onto the semiconductor layer 114 after the oxide layer 116 is removed. In other embodiments, a high-K metal gate layer can be disposed onto the semiconductor layer 114 after the oxide layer 116 is removed and a layer of sulfur 120 is formed on the surface of the semiconductor layer 114. In other embodiments, a layer of sulfur 120 is formed with the surface of the semiconductor layer 114. In some embodiments, a photoresist layer can be formed and patterned (by processes such as photolithography, e-beam lithography, maskless patterning or molecular print) on the surface of the semiconductor layer 114, and an annealing process can be carried out to remove the sulfur layer through the openings of the photoresist.

In some embodiments, the chamber may have a plasma-assisted process. In other embodiments, the process is plasma free. In some embodiments, the temperature of the chamber is in a range of 20° C. to 400° C., and in some other embodiments the temperature of the chamber is 20° C. to 100° C. In some embodiments, the pressure of the chamber is at a range of 1 Torr to 100 Torr, and in other embodiments 3 Torr to 50 Torr. In some embodiments, the molar ratio of ammonia to hydrogen sulfide is 1:1 to 3:1, and in some other embodiments 1:1 to 2:1. In some embodiments, the temperature and pressure of the chamber is operated in a range that the ammonia and hydrogen sulfide are kept in the gas phase.

Figure 7:
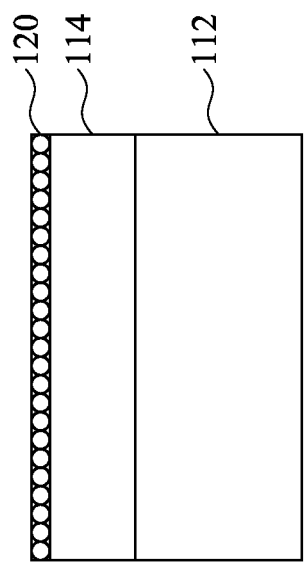
FIGS. 7-8 are schematic diagrams illustrating a semiconductor substrate that may utilize the method depicted in FIG. 6, in accordance with some embodiments.
Figure 8:
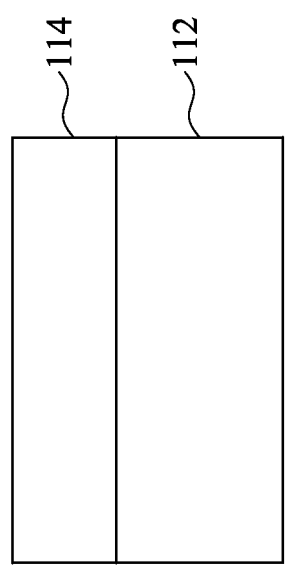

FIG. 2 is a flow chart illustrating a method of passivating a semiconductor substrate, in accordance with some embodiments. FIGS. 7-8 are schematic diagrams illustrating a semiconductor substrate that may utilize the method depicted in FIG. 2, in accordance with some embodiments. With reference to FIGS. 2 and 7-8 and other figures, the method 200 and the semiconductor substrate in FIGS. 7-8 are collectively described.

Figure 6:
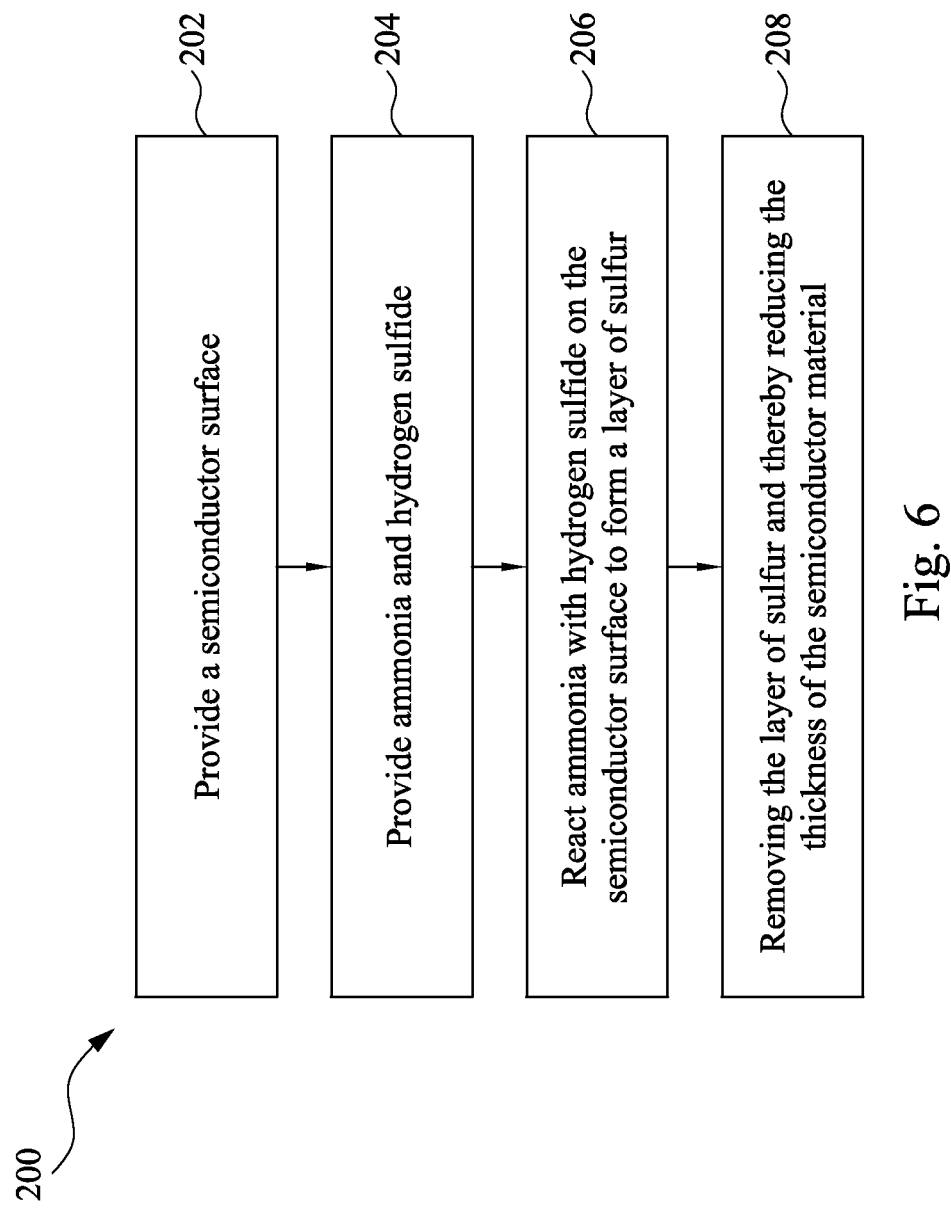
FIG. 6 is a flow chart illustrating a method of passivating a semiconductor substrate, in accordance with some embodiments.

Referring to FIGS. 6 and 7, the method 200 begins at operation 202, providing a semiconductor surface. The semiconductor substrate in FIG. 7 includes a substrate layer 112 and a semiconductor layer 114. The term "substrate layer" as used herein refers to a layer of material that serves as a basis for subsequent processing operations.

In embodiments, the substrate layer 112 may be a 200 mm, 300 mm or 450 mm silicon wafer, or other substrate used to fabricate microelectronic devices and the like. In some embodiments, the substrate layer 112 may be a material such as crystalline silicon (e.g., Si<100>, Si<111> or Si<001>), silicon oxide, strained silicon, silicon$_{(1-x)}$germanium$_x$, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, or sapphire. The substrate layer 112 may have a circular wafer, as well as, rectangular or square panels. Furthermore, the substrate layer 112 can also include dielectric materials such as silicon dioxide, organosilicates, and carbon doped silicon oxides. The substrate layer 112 may also include one or more conductive metals, such as nickel, titanium, platinum, molybdenum, rhenium, osmium, chromium, iron, aluminum, copper, tungsten, or combinations thereof. Furthermore, the substrate layer 112 can include any other materials such as metal nitrides, metal oxides and metal alloys, depending on the application. In some embodiments, the substrate layer 112 can form a contact structure, a metal silicide layer, or a gate structure including a gate dielectric layer and a gate electrode layer to facilitate connecting with an interconnect feature, such as a plug, via, contact, line, and wire, subsequently formed thereon, or suitable structures utilized in semiconductor devices.

In embodiments, the substrate layer 112 has a semiconductor layer 114 disposed thereon. The semiconductor layer 114 can be a germanium (Ge) containing layer, such as Ge or SiGe, a III-V compound containing layer, and the like. Suitable examples of the III-V compound containing layer include GaAs, InP, InAs, GaAs, GaP, InGaAs, InGaAsP, InAlAs, GaSb, InSb, the like, or combinations thereof.

In some embodiments, the semiconductor layer 114 may have had an oxide layer disposed thereon prior to operation 202 of method 200, and then the semiconductor layer 114 is later processed to remove the oxide layer. In some embodiments, the surface of the semiconductor layer 114 is generally free of oxide. In some embodiments, the oxide layer disposed prior to operation 202 of method 200 may be a native oxide formed on the surface of the semiconductor layer 114 due to the exposure to either atmosphere or to one or more fabrication processes that cause native oxide to form, such as a wet process. In other embodiments, the oxide layer disposed prior to operation 202 of method 200 may be a layer disposed on the semiconductor layer 114 and patterned as a hard mask. In some embodiments, the processes to remove the oxide layer may include a chemical mechanical polishing (CMP) process. In other embodiments, a suitable etching process can be used to remove the oxide layer.

Referring to FIGS. 6 and 8, the method 200 proceeds to operation 204, providing ammonia and hydrogen sulfide. In some embodiments, the semiconductor substrate is placed in a processing chamber, and then supplied with ammonia and hydrogen sulfide. In some embodiments, the ammonia and hydrogen sulfide is supplied from a common source. In other embodiments, the ammonia and hydrogen sulfide are both in gas phase when supplied to the chamber. In some embodiments, the ammonia and hydrogen sulfide is adsorbed onto the surface of the semiconductor layer 114.

Referring to FIGS. 6 and 8, the method 200 proceeds to operation 206, reacting ammonia and hydrogen sulfide to form a layer of sulfur. In some embodiments, the semiconductor substrate is placed in a processing chamber, and then the ammonia and hydrogen sulfide is reacted to form a layer of sulfur 120. In some embodiments, the ammonia and hydrogen sulfide are all in gas phase while in the chamber. In some embodiments, the ammonia and hydrogen sulfide is adsorbed onto the surface of the semiconductor layer 114 and reacted to form a layer of sulfur 120. In some embodiments, the layer of sulfur 120 can be formed by the adsorbed hydrogen sulfide. In some embodiments, the layer of sulfur 120 can be formed from the adsorbed hydrogen sulfide and by the reaction of ammonia and hydrogen sulfide.

In some embodiments, the layer of sulfur 120 can passivate the surface of the semiconductor layer 114 to prevent contact with air and/or water. In some embodiments, a layer of sulfur 120 is formed with the surface of the semiconductor layer 114. In some embodiments, the layer of sulfur 120 forms a bond with the surface of the semiconductor layer 114. In other embodiments, after forming the layer of sulfur 120 with the semiconductor layer 114, the method 200 may optionally proceed to operation 208, the layer of sulfur 120 can further be removed and thereby reducing the thickness of the semiconductor layer 114. In some embodiments, when the layer of sulfur 120 forms a bond with the surface of the semiconductor layer 114, removing the layer of sulfur 120 will remove a portion of the surface of the semiconductor layer 114 and thereby reducing the thickness of the semiconductor layer 114. In another embodiment, after forming the layer of sulfur 120 with the semiconductor layer 114, the layer of sulfur 120 can further be removed and a layer of native oxide is allowed to form, the native oxide is later etched by a suitable method, by repeating the above operations the thickness of the semiconductor layer 114 can be reduced. In some embodiments, the suitable method for etching the native oxide can be the same as the use of ammonium sulfide as described herein. In some embodiments, the layer of sulfur 120 can be formed and removed a plurality of time to obtain a semiconductor layer 114 with a predefined thickness. In some embodiments, an annealing process can be used to remove the layer of sulfur 120. In some other embodiments, the annealing process is carried out at a temperature of 200° C. to 400° C. In some embodiments, the annealing process can be carried out in the processing chamber.

In embodiments, after operation 206 of method 200, subsequent layers can be formed and/or subsequent processes can be carried out. In some embodiments, a high-K metal gate layer can be disposed onto the semiconductor layer 114 after a layer of sulfur 120 is formed on the surface of the semiconductor layer 114. In some embodiments, a photoresist layer can be formed and patterned (by processes such as photolithography, e-beam lithography, maskless patterning or molecular print) on the surface of the semiconductor layer 114, and an annealing process can be carried out to remove the sulfur layer through the openings of the photoresist.

In some embodiments, the chamber may have a plasma-assisted process. In other embodiments, the process is plasma free. In some embodiments, the temperature of the chamber is in a range of 20° C. to 400° C., and in some other embodiments the temperature of the chamber is 20° C. to 100° C. In some embodiments, the pressure of the chamber is at a range of 1 Torr to 100 Torr, and in other embodiments 3 Torr to 50 Torr. In some embodiments, the molar ratio of ammonia to hydrogen sulfide is 1:1 to 3:1, and in some other embodiments 1:1 to 2:1. In some embodiments, the temperature and pressure of the chamber is operated in a range that the ammonia and hydrogen sulfide are kept in the gas phase.

In some embodiments, the method 100 and/or method 200 can be used for semiconductor surfaces of various semiconductor structures. In some embodiments, the semiconductor surface can be a surface of a channel region of a gate-all-around vertical nanowire of a field effect transistor. In other embodiments, the semiconductor surface can be a surface of an active layer in a light-emitting diode structure. One should note that the structures provided herein are merely examples and the embodiments of the present disclosure are not limited thereto.

Figure 9:
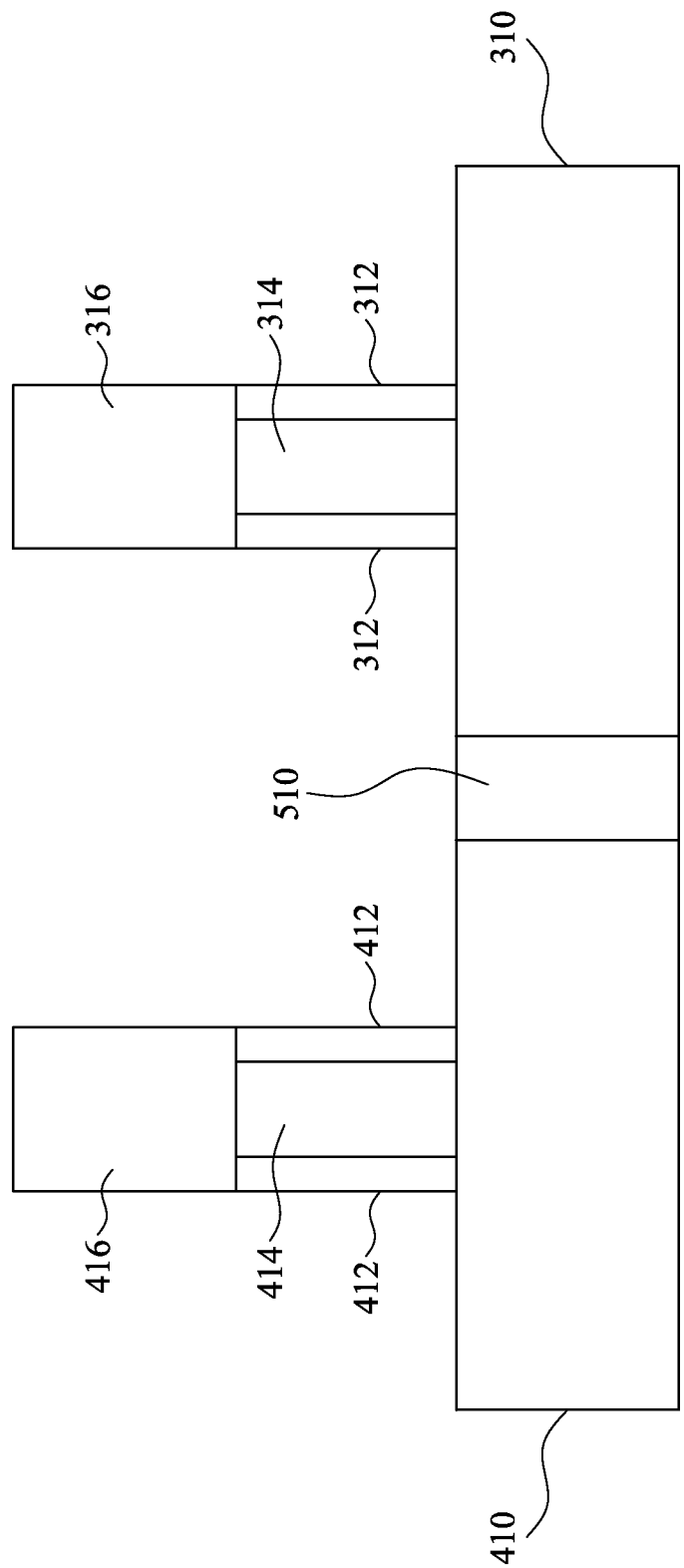

Referring to FIGS. 1 and 9, the method 100 begins at operation 102, providing a semiconductor surface. The semiconductor structure in FIG. 9 is a gate-all-around vertical (VGAA) nanowire of a field effect transistor (FET). The FET includes a N-type source 410, a P-type source 310, an isolating structure 510, a N-type channel region 414, a P-type channel region 314, N-type drain 416 and a P-type drain 316. In some embodiments, the FET may include a N-region oxide layer 412 surrounding the N-type channel region 414 and a P-region oxide layer 312 surrounding the P-type channel region 314. One should note that some of the structures have been omitted for the purpose of simplicity and clarity. In some embodiments, the semiconductor surface is the surface of the N-type channel region 414 and the surface of the P-type channel region 314.

In some embodiments, the N-type channel region 414 can be a III-V compound containing layer and the like, such as GaAs, InP, InAs, GaAs, GaP, InGaAs, InGaAsP, InAlAs, GaSb, InSb, the like, or combinations thereof. In other embodiments, the P-type channel region 314 can be a germanium (Ge) containing layer, such as Ge or SiGe.

In some embodiments, the N-region oxide layer 412 and the P-region oxide layer 312 are native oxides respectively formed on the surface of the N-type channel region 414 and the P-type channel region 314 due to the exposure to either atmosphere or to one or more fabrication processes that cause native oxide to form, such as a wet process. As the N-type channel region 414 and the P-type channel region 314 may be exposed to air or ambient atmosphere, the native oxide formed on the N-type channel region 414 and the P-type channel region 314 may have oxygen, nitrogen, carbon, sulfur, or other elements commonly contained in the air. In other embodiments, the N-region oxide layer 412 and the P-region oxide layer 312 may be a layer of oxide disposed on the N-type channel region 414 and the P-type channel region 314. In some embodiments, the N-region oxide layer 412 and the P-region oxide layer 312 may be an ammonium sulfide soluble oxide layer disposed on the N-type channel region 414 and the P-type channel region 314, for example, a germanium oxide (GeOx) layer. In some other embodiments, the N-region oxide layer 412 and the P-region oxide layer 312 may be the same or different, for example, the N-region oxide layer 412 may be a layer of germanium oxide disposed thereon and the P-region oxide layer 312 may be a native oxide.

Figure 10A:
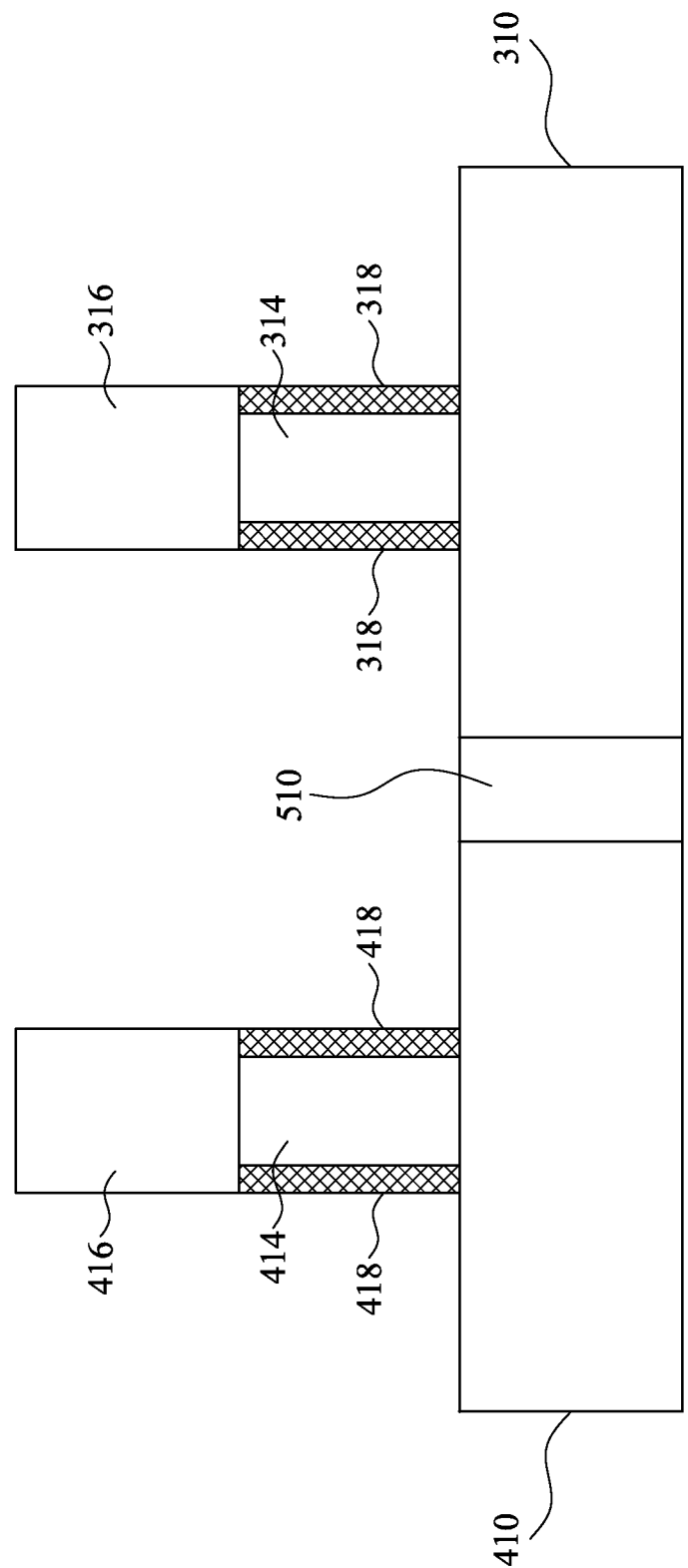

Referring to FIGS. 1 and 10a, the method 100 proceeds to operation 104, providing ammonia and hydrogen sulfide. In some embodiments, the FET is placed in a processing chamber, and then supplied with ammonia and hydrogen sulfide. In some embodiments, the ammonia and hydrogen sulfide is supplied from a common source. In other embodiments, the ammonia and hydrogen sulfide are both in gas phase when supplied to the chamber. In some embodiments, the ammonia and hydrogen sulfide is adsorbed onto the surface of the N-region oxide layer 412 and the P-region oxide layer 312.

Referring to FIGS. 1 and 10a, the method 100 proceeds to operation 106, reacting ammonia and hydrogen sulfide to form ammonium sulfide. In some embodiments, the FET is placed in a processing chamber, and then the ammonia and hydrogen sulfide is reacted to form ammonium sulfide. In some embodiments, the ammonia, hydrogen sulfide and ammonium sulfide are all in gas phase while in the chamber. In some embodiments, the ammonia and hydrogen sulfide is adsorbed onto the surface of the N-region oxide layer 412 and the P-region oxide layer 312 and reacted to form N-region ammonium sulfide 418 and P-region ammonium sulfide 318. In other embodiments, the ammonia and hydrogen sulfide is reacted in the chamber to form ammonium sulfide and then adsorbed onto the surface of the N-region oxide layer 412 and the P-region oxide layer 312. In some embodiments, the N-region ammonium sulfide 418 and P-region ammonium sulfide 318 can be the same or different.

Referring to FIGS. 1 and 10a, the method 100 proceeds to operation 108, etching the oxide on the semiconductor layer with ammonium sulfide. The N-region ammonium sulfide 418 and P-region ammonium sulfide 318 on the surface of the N-region oxide layer 412 and the P-region oxide layer 312 can etch away the N-region oxide layer 412 and the P-region oxide layer 312. In some embodiments, the N-region oxide layer 412 and the P-region oxide layer 312 can be a native oxide of the N-type channel region 414 and the P-type channel region 314. In other embodiments, the N-region oxide layer 412 and the P-region oxide layer 312 can be an ammonium sulfide soluble oxide layer disposed on the N-type channel region 414 and the P-type channel region 314.

Figure 10B:
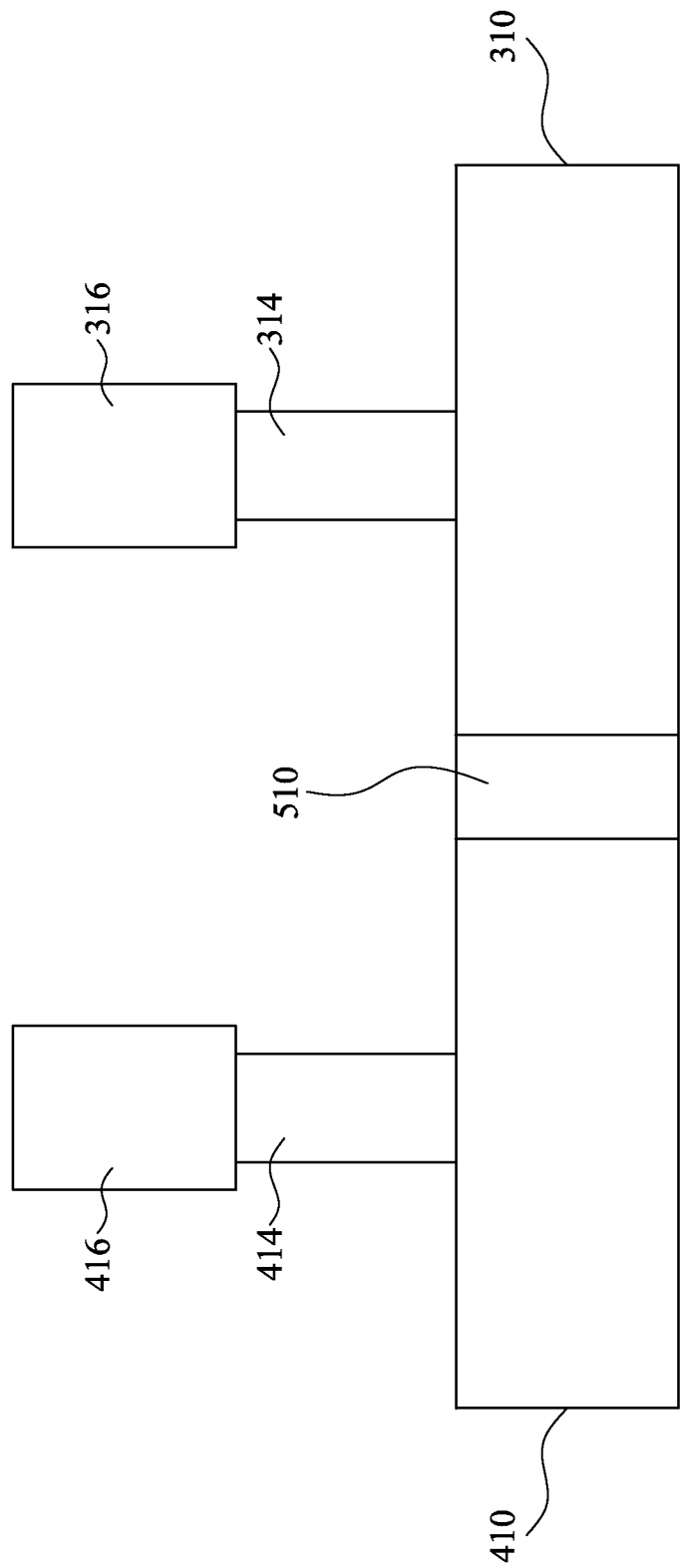

Referring to FIGS. 1 and 10b. In some embodiments, at operation 108 of method 100, after reacting ammonia and hydrogen sulfide to form N-region ammonium sulfide 418 and P-region ammonium sulfide 318, the ammonium sulfide may be removed right after etching the N-region oxide layer 412 and the P-region oxide layer 312 and a layer of sulfur is not formed to passivate the surface. In some embodiments, the N-region ammonium sulfide 418 and P-region ammonium sulfide 318 is removed right after etching the oxide layer by ventilation and a layer of sulfur is not formed. In another embodiment, by controlling the amount of ammonia and hydrogen sulfide, the amount of ammonium sulfide formed is controlled to sufficiently etch the oxide layer but not form a layer of sulfur.

Figure 11B:
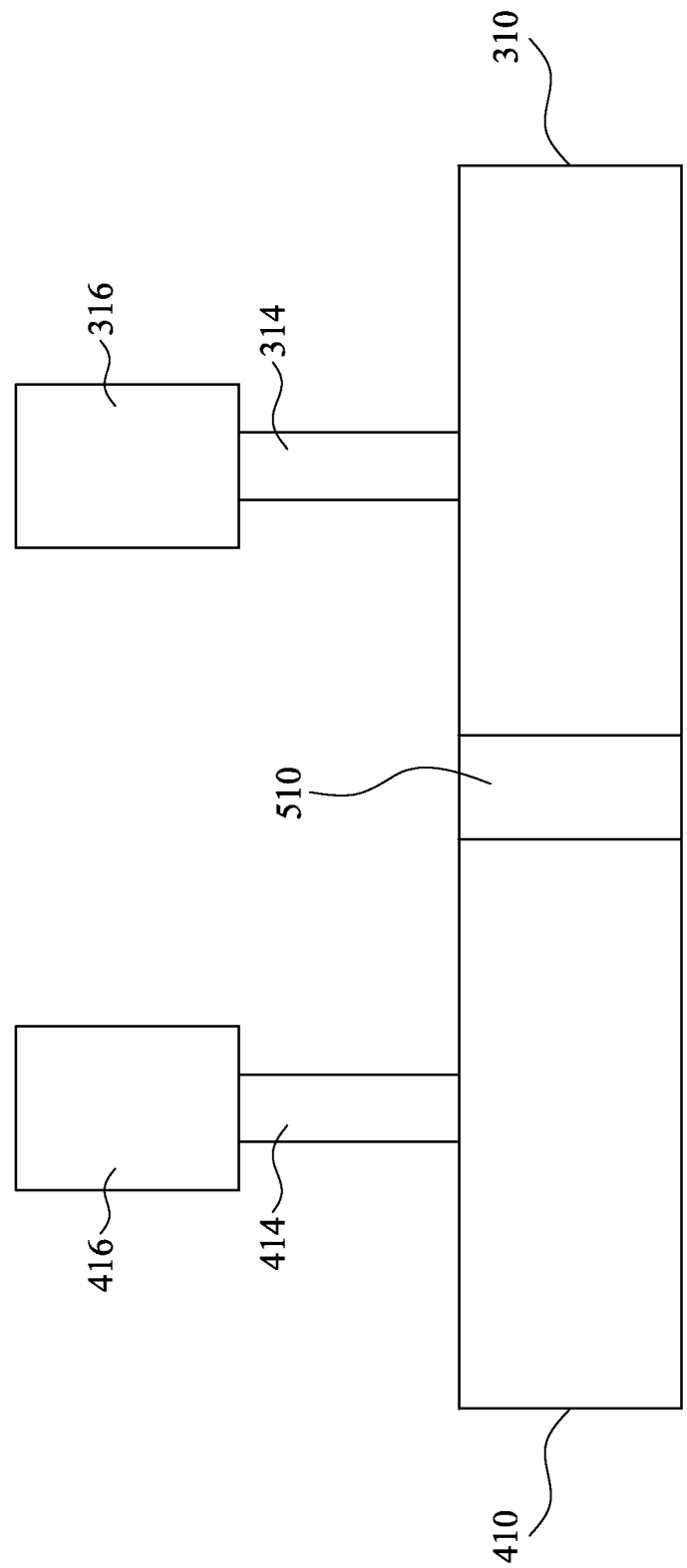

Referring to FIGS. 1 and 11a, the method 100 proceeds to operation 110, forming a layer of sulfur. In some embodiments, after the N-region ammonium sulfide 418 and P-region ammonium sulfide 318 etches away the N-region oxide layer 412 and the P-region oxide layer 312, a layer of N-region sulfur 420 and a layer of P-region sulfur 320 may be formed on the surface of the N-type channel region 414 and the P-type channel region 314. In some embodiments, the N-region ammonium sulfide 418 and P-region ammonium sulfide 318 etches away the N-region oxide layer 412 and the P-region oxide layer 312 and the layer of N-region sulfur 420 and the layer of P-region sulfur 320 is formed on the surface of the N-type channel region 414 and the P-type channel region 314 simultaneously. In some embodiments, the layer of N-region sulfur 420 and the layer of P-region sulfur 320 can be the same or different. In some embodiments, the N-region ammonium sulfide 418 and P-region ammonium sulfide 318 are removed right after etching the N-region oxide layer 412 and the P-region oxide layer 312 and the layer of N-region sulfur 420 and the layer of P-region sulfur 320 are not formed. In some embodiments, the P-region ammonium sulfide 318 is removed right after etching and a layer of N-region sulfur 420 is formed. In some embodiments, the N-region ammonium sulfide 418 and P-region ammonium sulfide 318 is removed right after etching the N-region oxide layer 412 and the P-region oxide layer 312 by ventilation and the layer of N-region sulfur 420 and the layer of P-region sulfur 320 are not formed. In another embodiment, by controlling the amount of ammonia and hydrogen sulfide, the amount of N-region ammonium sulfide 418 and P-region ammonium sulfide 318 formed is controlled to sufficiently etch the N-region oxide layer 412 and the P-region oxide layer 312 but not form a layer of N-region sulfur 420 and the layer of P-region sulfur 320. In some embodiments, the layer of N-region sulfur 420 and the layer of P-region sulfur 320 surrounds the N-type channel region 414 and the P-type channel region 314. In some other embodiments, the layer of N-region sulfur 420 surrounds the N-type channel region 414, and the layer of P-region sulfur 320 covers a part of the P-type channel region 314. In some embodiments, the layer of N-region sulfur 420 and the layer of P-region sulfur 320 can passivate the surface of the N-type channel region 414 and the P-type channel region 314 to prevent contact with air and/or water. In some embodiments, the layer of P-region sulfur 320 can passivate the surface of the P-type channel region 314 while the layer of N-region sulfur 420 is removed.

Referring to FIGS. 1 and 1ib. In some embodiments, at operation 110 of method 100, the layer of N-region sulfur 420 and the layer of P-region sulfur 320 may be removed and the surface is not passivated. In other embodiments, after forming the layer of N-region sulfur 420 and the layer of P-region sulfur 320 with the N-type channel region 414 and the P-type channel region 314, the layer of N-region sulfur 420 and the layer of P-region sulfur 320 can further be removed and thereby reducing the thickness of the N-type channel region 414 and the P-type channel region 314. In some embodiments, the layer of N-region sulfur 420 and the layer of P-region sulfur 320 can be formed and removed a plurality of time to obtain a N-type channel region 414 and the P-type channel region 314 with a predefined thickness. In another embodiment, after forming the layer of N-region sulfur 420 and the layer of P-region sulfur 320 with the N-type channel region 414 and the P-type channel region 314 respectively, the layer of N-region sulfur 420 and the layer of P-region sulfur 320 can further be removed and a layer of native oxide is allowed to form, the native oxide is later etched by a suitable method, by repeating the above operations the thickness of the N-type channel region 414 and the P-type channel region 314 can be reduced. In some embodiments, the suitable method for etching the native oxide can be the use of ammonium sulfide as described herein. In some embodiments, an annealing process can be used to remove the layer of N-region sulfur 420 and the layer of P-region sulfur 320. In some embodiments, the layer of N-region sulfur 420 is removed to obtain a N-type channel region 414 with a predefined thickness, and the layer of P-region sulfur 320 is not removed. In some other embodiments, the annealing process is carried out at a temperature of 200° C. to 400° C. In some embodiments, the annealing process can be carried out in the processing chamber.

Figure 12:
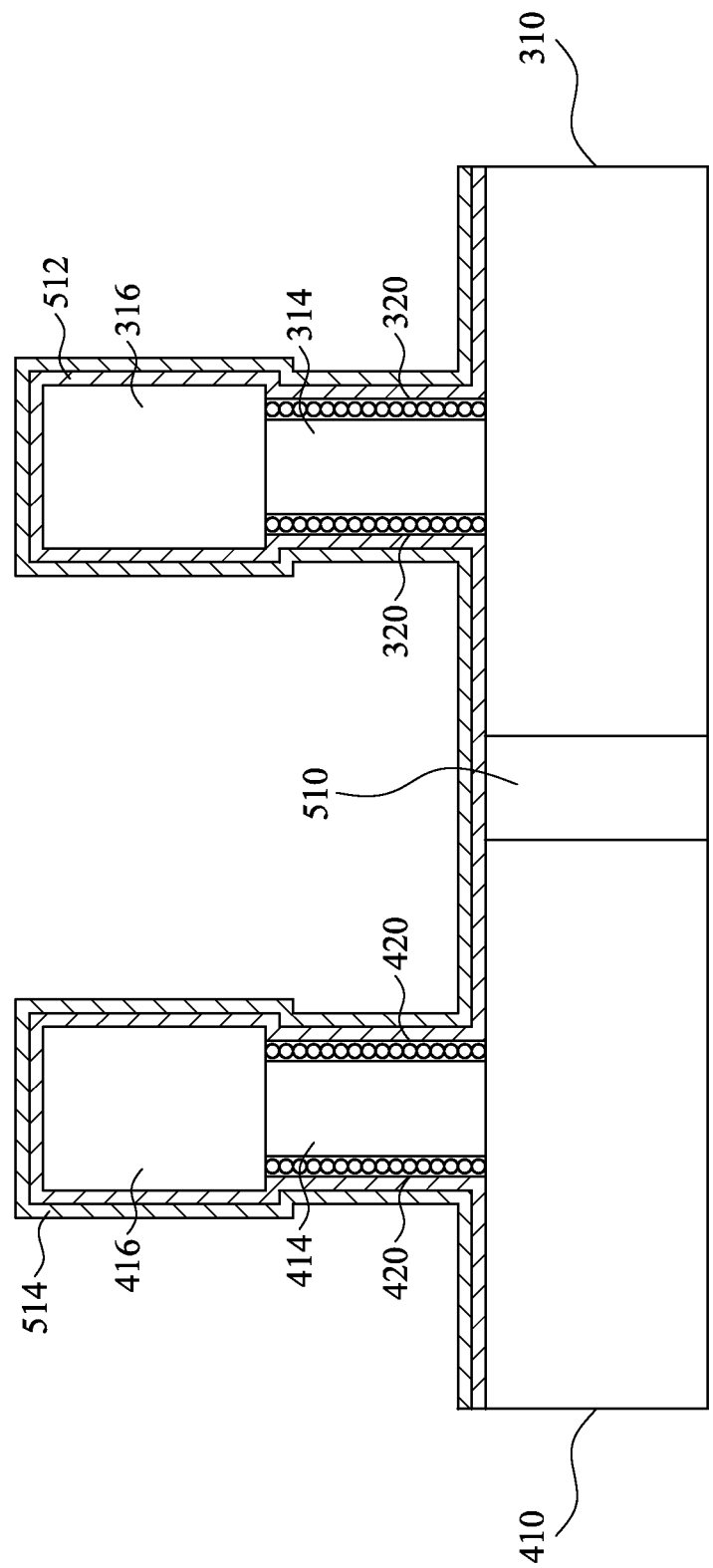

Referring to FIG. 12, in some embodiments, after operation 110 of method 100, subsequent layers can be formed and/or subsequent processes can be carried out. In some embodiments, a dielectric layer 512 and a high-K metal gate layer 514 can be disposed on the FET after the N-region oxide layer 412 and the P-region oxide layer 312 are removed. In other embodiments, a dielectric layer 512 and a high-K metal gate layer 514 can be disposed on the FET after the N-region oxide layer 412 and the P-region oxide layer 312 are removed and a layer of sulfur 120 is formed on the surface of the N-type channel region 414 and the P-type channel region 314. In some embodiments, a photoresist layer can be formed and patterned (by processes such as photolithography, e-beam lithography, maskless patterning or molecular print) on the FET to form other features. One should note that some of the features of the FET structure have been omitted for the purpose of simplicity and clarity, and the embodiments of the present disclosure are not limited thereto.

In some embodiments, the chamber may have a plasma-assisted process. In other embodiments, the process is plasma free. In one or more embodiments, the temperature of the chamber is in a range of 20° C. to 400° C., and in other embodiments the temperature of the chamber is 20° C. to 100° C. In some embodiments, the pressure of the chamber is at a range of 1 Torr to 100 Torr, and in other embodiments 3 Torr to 50 Torr. In some embodiments, the molar ratio of ammonia to hydrogen sulfide is 1:1 to 3:1, and in some other embodiments 1:1 to 2:1. In some embodiments, the temperature and pressure of the chamber is operated in a range that the ammonia and hydrogen sulfide are kept in the gas phase.

In embodiments, ammonia and hydrogen sulfide is reacted to form ammonium sulfide in a semiconductor processing chamber, and thus ammonium sulfide can be used to clean and remove oxides on a semiconductor surface without the concern of ESH and storage of the ammonium sulfide. In another embodiment, the ammonium sulfide can be used to passivate a semiconductor surface by forming a layer of sulfur, and thus preventing the formation of native oxides. In some other embodiments, the layer of sulfur can be removed and thereby reducing the thickness of the semiconductor material. In other embodiments, the ammonia, hydrogen sulfide and ammonium sulfide can all be used in the gas phase.

In embodiments, a method for removing an oxide on a semiconductor material is provided. The method includes providing ammonia and providing hydrogen sulfide onto a semiconductor surface in which an oxide is disposed thereto, reacting the ammonia with hydrogen sulfide to form ammonium sulfide, and then cleaning and removing the oxide on the semiconductor surface by using the ammonium sulfide.

In some embodiments, a method for passivating a semiconductor material is provided. The method includes providing ammonia and hydrogen sulfide onto a semiconductor surface and reacting the ammonia with hydrogen sulfide to form a layer of sulfur to passivate the semiconductor surface.

In some other embodiments, a method for reducing the thickness of a semiconductor material is provided. The method includes providing ammonia and hydrogen sulfide onto a semiconductor surface of a semiconductor material, reacting the ammonia with hydrogen sulfide to form a layer of sulfur with the semiconductor surface, then removing the layer of sulfur and thereby reducing the thickness of the semiconductor material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing an oxide on a semiconductor material comprising:
   providing ammonia and hydrogen sulfide on a semiconductor surface overlaid with an oxide;
   reacting the ammonia with the hydrogen sulfide to form an ammonium sulfide; and
   removing the oxide on the semiconductor surface by the ammonium sulfide.

2. The method of claim 1, further comprising passivating the semiconductor surface by reacting ammonia with hydrogen sulfide to form a layer of sulfur with the semiconductor surface.

3. The method of claim 1, wherein the semiconductor surface is a surface of a channel region of a gate-all-around vertical nanowire of a field effect transistor.

4. The method of claim 1, wherein the ammonia, the hydrogen sulfide and the ammonium sulfide are in gas phase.

5. The method of claim 1, wherein the molar ratio of the ammonia to the hydrogen sulfide is 1:1 to 2:1.

6. The method of claim 1, wherein the semiconductor surface is a surface of a Ge or III-V semiconductor.

7. The method of claim 6, wherein the oxide on the semiconductor material is a native oxide of the Ge or III-V semiconductor.

8. A method for passivating a semiconductor material comprising:
providing ammonia and hydrogen sulfide on a semiconductor surface; and
reacting the ammonia with the hydrogen sulfide to form a layer of sulfur on the semiconductor surface as a passivation layer over the semiconductor surface.

9. The method of claim 8, wherein the semiconductor surface is a surface of a Ge or III-V semiconductor.

10. The method of claim 8, wherein the semiconductor surface is a surface of a channel region of a gate-all-around vertical nanowire of a field effect transistor.

11. The method of claim 8, wherein the ammonia and the hydrogen sulfide are in gas phase.

12. The method of claim 8, wherein the molar ratio of the ammonia to the hydrogen sulfide is 1:1 to 2:1.

13. A method for reducing the thickness of a semiconductor material comprising:
providing ammonia and hydrogen sulfide on a semiconductor surface of a semiconductor material;
reacting the ammonia with the hydrogen sulfide to form a layer of sulfur on the semiconductor surface; and
removing the layer of sulfur and thereby reducing the thickness of the semiconductor material.

14. The method of claim 13, further comprising repeating the forming and removing of the layer of sulfur a plurality of time to obtain a predefined semiconductor material thickness.

15. The method of claim 13, further comprising forming another layer of sulfur with the semiconductor surface as a passivation layer over the semiconductor material after reducing the thickness of the semiconductor material.

16. The method of claim 13, wherein the layer of sulfur is removed by conducting an annealing.

17. The method of claim 13, wherein the semiconductor material is Ge or III-V semiconductor.

18. The method of claim 13, wherein the semiconductor surface is the surface of a channel region of a gate-all-around vertical nanowire of a field effect transistor.

19. The method of claim 13, wherein the ammonia and the hydrogen sulfide are in gas phase.

20. The method of claim 13, wherein the molar ratio of the ammonia to the hydrogen sulfide is 1:1 to 2:1.

* * * * *